US006228781B1

(12) United States Patent
Murugesh et al.

(10) Patent No.: US 6,228,781 B1
(45) Date of Patent: May 8, 2001

(54) SEQUENTIAL IN-SITU HEATING AND DEPOSITION OF HALOGEN-DOPED SILICON OXIDE

(75) Inventors: Laxman Murugesh, Fremont; Maciek Orczyk, Cupertino; Pravin Narawankar, Sunnyvale; Jianmin Qiao, Fremont; Turgut Sahin, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/825,877

(22) Filed: Apr. 2, 1997

(51) Int. Cl.[7] ........................... H01L 21/31; H01L 21/469
(52) U.S. Cl. ........................... 438/784; 438/788; 438/789
(58) Field of Search .................................. 438/784, 788, 438/789

(56) References Cited

U.S. PATENT DOCUMENTS

| 5,156,881 | 10/1992 | Okano et al. | 427/572 |
|---|---|---|---|
| 5,429,995 | * 7/1995 | Nishiyama | 437/238 |
| 5,661,093 | * 8/1997 | Ravi | 438/763 |
| 5,763,010 | * 6/1998 | Guo | 427/376.2 |
| 5,827,785 | * 10/1998 | Bhan | 438/784 |
| 5,908,672 | * 6/1999 | Ryu | 427/574 |
| 5,937,323 | * 8/1999 | Orczyk | 438/624 |
| 6,001,728 | * 12/1999 | Bhan | 438/623 |

OTHER PUBLICATIONS

N. Hayasaka et al., High–Quality and Low Dielectric Constant $SiO_2$ CVD Using High Density Plasma, 1993 Dry Process Symposium, pp. 163–168.

D. Carl, et al., The Effect of $O_2:C_2F_6$ Ratios And Low Frequency Power On The Gap Fill Properties And Stability Of F–TEOS Films, Feb. 21–22, 1995 DUMIC Conference, 1995 ISMIC, pp. 234–240.

Takashi Fukada et al., Preparation Of SiOF Films With Low Dielectric Constant By ECR Plasma CVD, Feb. 21–22, 1995 DUMIC Conference, 1995 ISMIC, pp. 43–49.

Tetsuo Matsuda et al., Dual Frequency Plasma CVD Fluorosilicate Glass Deposition For 0.25 μm Interlevel Dielectrics, Feb. 21–22, 1995 DUMIC Conference, 1995 ISMIC, pp. 22–28.

M.J. Shapiro et al., Dual Frequency Plasma CVD Fluorosilicate Glass Water Absorption And Stability, Feb. 21–22, 1995 DUMIC Conference, 1995 ISMIC, pp. 118–123.

Ravi K. Laxman, Low ∈ Dielectrics: CVD Fluorinated Silicon Dioxides, Semiconductor International, May 1995, pp. 71–74.

* cited by examiner

Primary Examiner—Charles Bowers
Assistant Examiner—Erik Kielin
(74) Attorney, Agent, or Firm—Townsend & Townsend & Crew

(57) ABSTRACT

A low dielectric constant insulating film on a substrate is formed by introducing a process gas comprising a silicon source, a fluorine source, and oxygen into a chamber. The process gas is formed into a plasma to deposit at least a first portion of the insulating film over the substrate. The wafer and the first portion of the insulating film are then heated to a temperature of about 100–500° C. for a period of time. The film may include several separate portions, the deposition of each of which is followed by a heating step. The film has a low dielectric constant and good gap-fill and stability due to the lack of free fluorine in the film.

16 Claims, 6 Drawing Sheets

SEQUENTIAL IN-SITU HEATING AND DEPOSITION OF HALOGEN-DOPED SILICON OXIDE

BACKGROUND OF THE INVENTION

The present invention relates to the fabrication of integrated circuits. More particularly, the invention provides a technique, including a method and apparatus, for the deposition of a fluorine-doped insulating film having a reduced dielectric constant.

Semiconductor device geometries have dramatically decreased in size since such devices were first introduced several decades ago. Since then, integrated circuits have generally followed the two year/half-size rule (often called "Moore's Law") which means that the number of devices which will fit on a chip doubles every two years. Today's wafer fabrication plants are routinely producing integrated circuits having 0.5 and even 0.35 micron feature sizes, and tomorrow's plants soon will be producing devices having even smaller geometries.

As device sizes become smaller and integration density increases, issues which were not previously considered important by the industry are becoming of concern. With the advent of multilevel metal technology in which three, four, or more layers of metal are formed on the semiconductors, one goal of semiconductor manufacturers is lowering the dielectric constant of insulating layers such as intermetal dielectric layers. Low dielectric constant films are particularly desirable for intermetal dielectric (IMD) layers to reduce the RC time delay of the interconnect metallization, to prevent cross-talk between the different levels of metallization, and to reduce device power consumption.

Many approaches to obtain lower dielectric constants have been proposed. One of the more promising solutions is the incorporation of fluorine or other halogen elements, such as chlorine or bromine, into a silicon oxide layer. Examples of halogen incorporation in films are described in U.S. patent application Ser. No. 08/548,391, filed Oct. 25, 1995 and entitled "METHOD AND APPARATUS FOR IMPROVING FILM STABILITY OF HALOGEN-DOPED SILICON OXIDE FILMS", and Ser. No. 08/538,696, filed Oct. 2, 1995 and entitled "USE OF $SIF_4$ TO DEPOSIT F-DOPED FILMS OF GREATER STABILITY", both of which are assigned to Applied Materials, Inc.

It is believed that fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are also referred to as fluoro silicate glass (FSG) films. The Ser. Nos. 08/548,391 and 08/538,696 patent applications each disclose formation of a plasma from a process gas that includes TEOS ($Si(OC_2H_5)_4$) mixed with a helium carrier gas, oxygen ($O_2$) and a fluorine source to deposit an FSG film. In illustrated embodiments of each application, the plasma is formed by the application of radio frequency energy to a pair of capacitively-coupled electrodes. Such a deposition method is referred to as plasma enhanced chemical vapor deposition (PECVD).

High density plasma (HDP) CVD reactors in which inductively coupled coils are employed to generate the plasma under very low pressure conditions (in the millitorr range) have also been used to deposit intermetal silicon oxide and FSG layers between closely spaced gaps on semiconductor structures. A plasma generated by such an HDP-CVD reactor has an ion density approximately two orders of magnitude or more greater than the ion density of a standard, capacitively coupled PECVD plasma. It is believed that the low chamber pressure employed in HDP-CVD reactors provides active species having a long mean free path. This factor, in combination with the density of the plasma, permits a significant number of plasma constituents to reach even the bottom portions of deep, tightly spaced gaps, and deposits a film with excellent gap-fill properties. Also, argon or a similar heavy inert gas is introduced into the reaction chamber to promote sputtering during deposition. It is believed that the sputtering element of HDP deposition etches away deposition on the sides of gaps being filled, which also contributes to the increased gap-fill of HDP-deposited films.

Some HDP reactors allow the plasma to be biased toward the substrate by the application of an electric field to further promote the sputtering effect. In one such reactor, the plasma is biased by application of RF energy from a bias RF (BRF) generator to an electrode in the chamber. Plasma formation in this reactor is formed by application of RF energy from a source RF (SRF) generator to a coil. The use of HDP-CVD reactors such as this is becoming increasingly important in the deposition of fluorine-doped silicon oxide intermetal dielectric layers.

In addition to decreasing the dielectric constant, incorporating fluorine in intermetal silicon oxide layers also helps solve common problems encountered in fabricating smaller geometry devices, such as filling closely spaced gaps on semiconductor structures. Because fluorine is an etching species, it is believed that fluorine doping introduces an etching effect on the growing film. This simultaneous deposition/etching effect allows FSG films to have improved gap filling capabilities such that the films are able to adequately cover adjacent metal layers having an aspect ratio of 1.8 or more.

Thus, manufacturers desire to include fluorine in various dielectric layers and particularly in intermetal dielectric layers. One problem encountered in the deposition of FSG layers is film stability. Loosely bound fluorine atoms in the lattice structure of some FSG films result in the films having a tendency to absorb moisture. The absorbed moisture increases the film's dielectric constant and can cause further problems when the film is exposed to a thermal process, such as an anneal process, during subsequent processing steps. The high temperature of such thermal processes can move the absorbed water molecules and loosely bound fluorine atoms out of the oxide layer through metal or other subsequently deposited layers. The excursion of molecules and atoms in this manner is referred to as outgassing. Such outgassing can be determined by detecting HF or $H_2O$ leaving the film as the film is heated to a specified temperature. It is desirable to have little or no outgassing at temperatures up to at least the maximum temperature used during substrate processing after the FSG film has been deposited (e.g., up to 450° C. in some instances).

Loosely bound fluorine atoms also tend to form hydrogen fluoride, a corrosive element which can attack metallization layers, forming gaps between the film and the metal. One solution to the problem of loosely bound fluorine atoms is to reduce the amount of fluorine used in a process gas. However, there is a correlation between the dielectric constant of an FSG film and the amount of fluorine in the process gas. Reducing the ratio of fluorine generally causes the dielectric constant of the resulting film to increase. Hence, it is desirable to include as much fluorine as possible in a film providing that other film qualities can be maintained within acceptable parameters.

From the above, it can be seen that it is desirable to produce oxide films having reduced dielectric constants. At the same time, it is also desirable to provide a method of increasing the stability of halogen-doped oxide films, thereby reducing moisture absorption and outgassing in the films.

Heat treatment steps in which a wafer is heated to a specified temperature for a specified time are employed for various reasons during substrate processing. For example, anneal steps are sometimes used to repair damage to a substrate after an ion implantation step or other processing step. Also, a brief heat treatment step has been employed to force absorbed water out of a layer such as a silicon oxide layer. The water degassing step is sometimes performed before deposition of an overlying diffusion barrier or metal layer to prevent the absorbed water from reacting with those layers during subsequent processing. As an example of this type of heat treatment step, a wafer may be heated to a temperature of about 400° C. for a period of 40 seconds. After completion of this heat treatment step, diffusion barrier layers and/or metal layers are deposited over the silicon oxide layer. An example of a heat treatment step that can be employed to stabilize FSG or other halogen-doped layers is described in U.S. patent application Ser. No. 08/646,862 filed May 8, 1996, entitled "THERMAL POST-DEPOSITION TREATMENT OF HALOGEN-DOPED FILMS TO IMPROVE FILM STABILITY AND REDUCE HALOGEN MIGRATION TO INTERCONNECT LAYERS" and assigned to Applied Materials, Inc.

Also, some substrate processing systems employ a multistep termination sequence after completing the processing of a wafer. During such a termination sequence, the substrate may be subjected to a heat step before being transferred out of the chamber. For example, in the HDP-CVD system mentioned above, an electrostatic chuck is used to secure the wafer during processing. During wafer processing, the RF energy applied to the coil from the SRF source during plasma formation indirectly heats the wafer while RF energy from the BRF source promotes sputtering and thereby directly heats the wafer. After processing is complete, a wafer dechucking step is employed to remove the wafer from the chuck. During the dechucking step, which may last between 10–30 seconds, BRF power is discontinued while SRF power is still applied to the coil and thus continues to heat the chamber.

SUMMARY OF THE INVENTION

The present invention provides a halogen doped layer having a low dielectric constant and improved film stability even at high halogen dopant levels. Film stability is improved by subjecting the film to one or more in-situ heat treatment steps. The present invention also provides a method and apparatus for forming such a film.

According to one embodiment of the invention, a method for forming a low dielectric constant insulating film on a substrate includes introducing a process gas comprising silicon, fluorine, and oxygen into a chamber. The process gas is formed into a plasma to deposit at least a first portion of the insulating film over the substrate. Deposition of the film is then stopped and the substrate is heated to a temperature of about 100–500° C. (preferably around 350° C.) for a brief period of time. It is believed that this heating step encourages free fluorine in the film to bond with silicon oxide, thereby eliminating or reducing free fluorine in the film.

Subsequent layers of film may then be deposited over the initial layer until an insulating film having a desired thickness is produced. Deposition of each portion of the insulating film is followed by a step of heating the wafer. The result is an insulating film which exhibits good gap-fill properties, has a low dielectric constant, and is very stable. The film may be produced with a relatively high ratio of fluorine in the process gas, as the existence of free fluorine in the film is reduced or eliminated by the additional heating steps.

For a further understanding of the objects and advantages of the present invention, reference should be made to the ensuing detailed description taken in conjunction with the accompanying drawings.

DETAILED DESCRIPTION OF THE PREFERRED EMBODIMENTS

I. Introduction

The present invention allows deposition of an insulating layer having a low dielectric constant (in some embodiments, less than about 3.5) and desirable gap fill characteristics. The insulating layer of the present invention is deposited using low temperatures in CVD chambers of conventional design.

II. An Exemplary CVD System

Figure 1A:
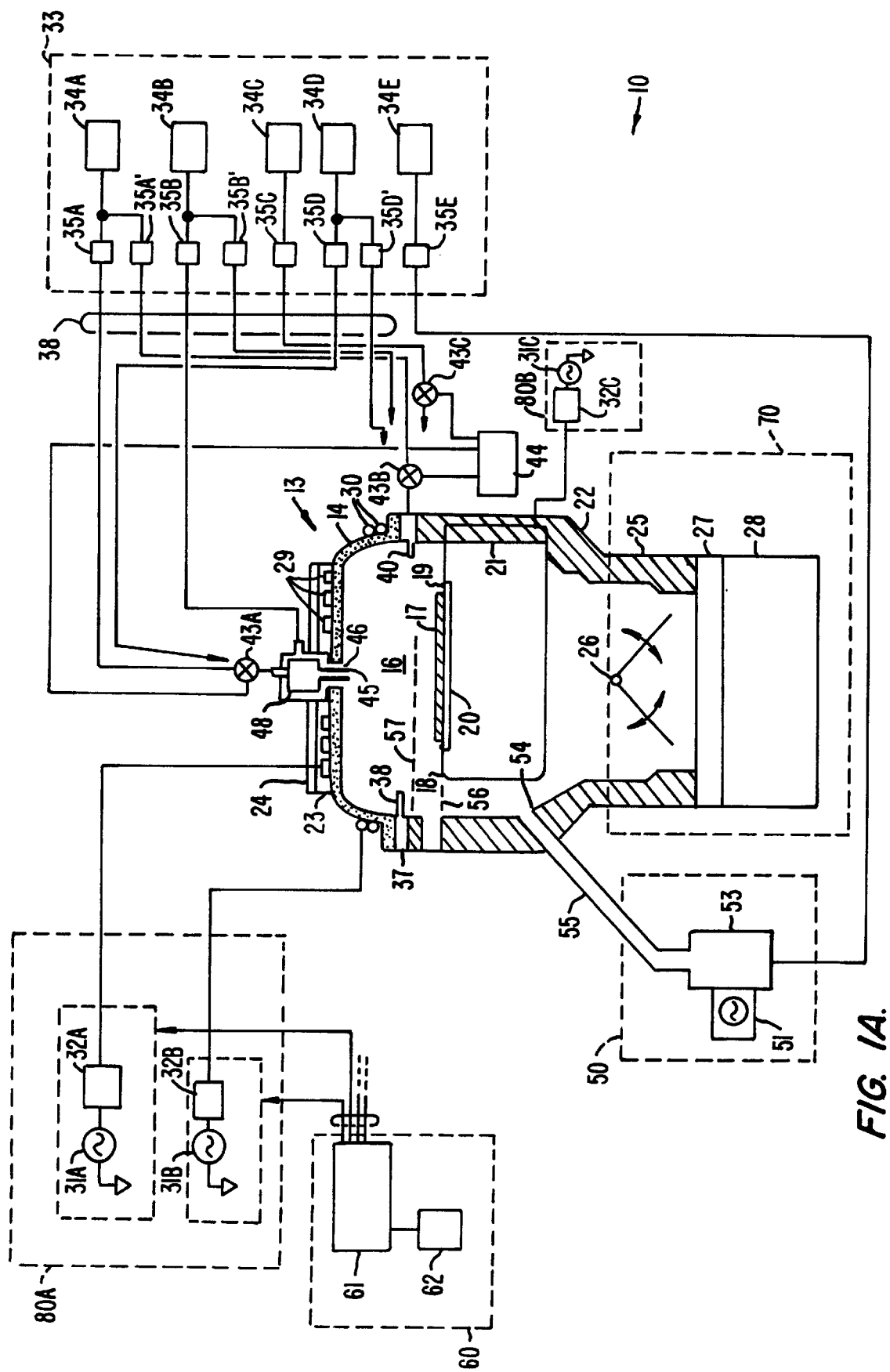
FIG. 1A is a simplified diagram of one embodiment of a high density chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a dielectric material, such as alumina or aluminum nitride. Dome 14 defines an upper boundary of a plasma processing region 16. Plasma processing region 16 is bounded on the bottom by the upper surface of substrate 17 and the substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. A motor (not shown) raises and lowers substrate support member 18 between a lower wafer loading position 56 and an upper processing position 57. Upon transfer into chamber 13, substrates are loaded onto a substrate receiving portion 19 of substrate support member 18. Substrate receiving portion 19 includes an electrostatic chuck 20 that secures the substrate to substrate support member 18 during substrate processing.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valves, gate valve, and turbomolecular pump allow accurate and stable control of chamber pressures from between about 1 to 100 millitorr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, while side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 19 to body member 22, which act a complimentary electrodes. The bias plasma system 80B serves to enhance the transport of plasma species created by the source plasma system 80A to the surface of the substrate. In a specific embodiment, bias RF generator provides up to 5,000 watts of RF power at 13.56 MHz.

In addition to the RF fields that are created within process zone 16, a direct current (DC) field may be created within process zone 16. For example, providing a negative DC potential to substrate receiving portion 19 relative to body member 22 may promote the transport of positively charged ions to the surface of substrate 17.

RF generators 31A and 31B include digitally-controlled synthesizers and operate over a frequency range between about 1.8 to about 2.1 MHz. Each generator includes an RF control circuit (not shown) that measures reflected power from the chamber and coil back to the generator, and adjusts the frequency of operation to obtain the lowest reflected power, as understood by a person of ordinary skill in the art.

RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
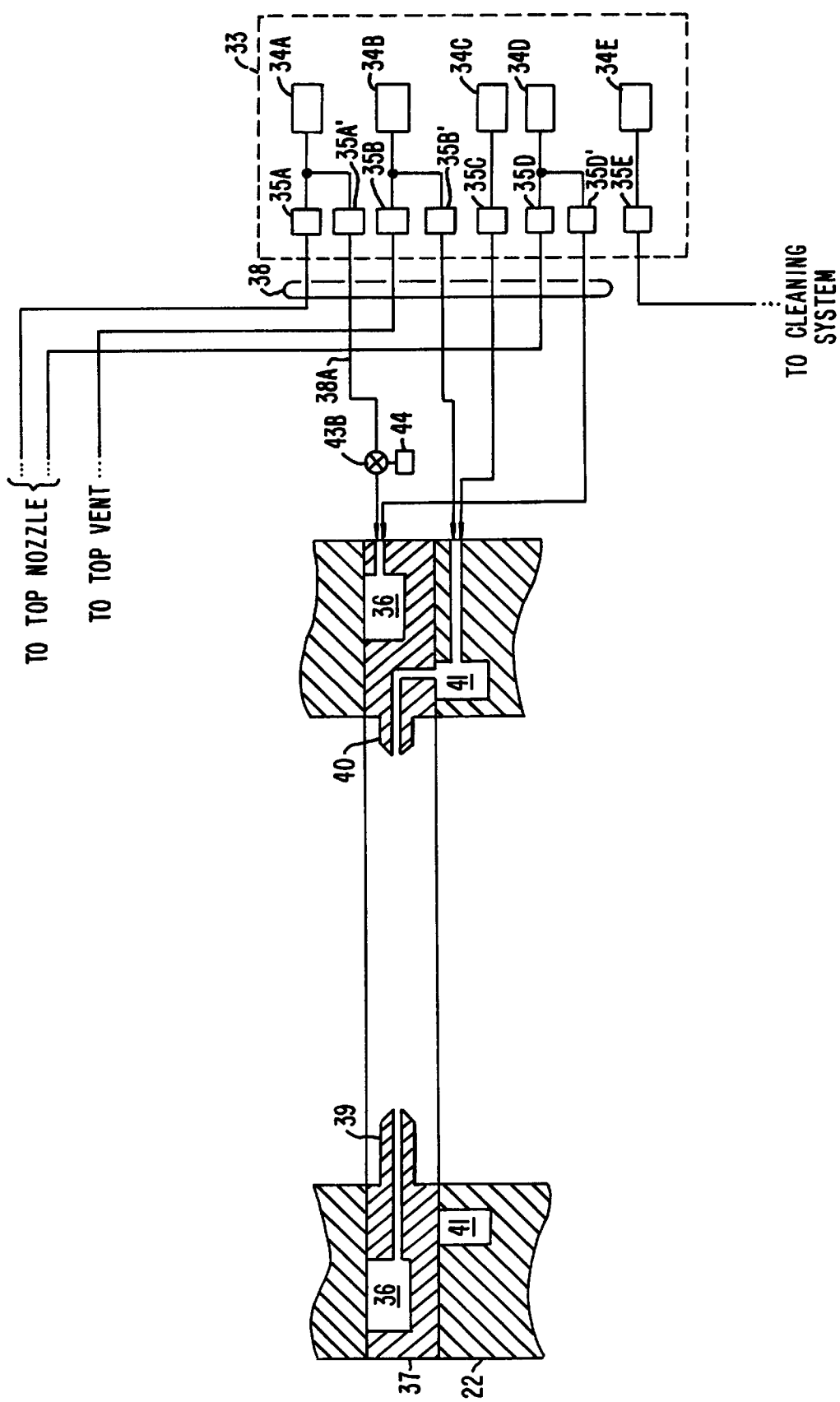
FIG. 1B is a simplified cross section of a gas ring that may be used in conjunction with the exemplary CVD processing chamber of FIG. 1A.

A gas delivery system 33 provides gases from several sources to the chamber for processing the substrate via gas delivery lines 38 (only some of which are shown). Gases are introduced into chamber 13 through a gas ring 37 and a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown) that provide a uniform flow of gas over the substrate. Nozzle length and nozzle angle may be changed by changing gas ring 37. This allows tailoring the uniformity profile and gas utilization efficiency for a particular process within an individual chamber. In a preferred embodiment, gas ring 37 has 12 source gas nozzles.

Gas ring 37 also has a plurality of oxidizer gas nozzles 40 (only one of which is shown), which in a preferred embodiment are co-planar with, and shorter than, source gas nozzles 39, and in one embodiment receive gas from body plenum 41. In some embodiments it is desirable to not mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In some embodiments, flammable, toxic, or corrosive gases, such as silane or silicon tetrafluoride ($SiF_4$), may be used. In these instances, it may be desirable to eliminate gas remaining in the gas delivery lines after a deposition. This may be accomplished using a 3-way valve, such as valve 43B, to isolate chamber 13 from delivery line 38A and vent delivery line 38A to vacuum foreline 44, for example. As shown in FIG. 1A, other similar valves, such as 43A and 43C, may be incorporated on other gas delivery lines, such as 35A and 35C. Such 3-way valves may be placed as close to chamber 13 as practical, to minimize the volume of the unvented gas delivery line (between the 3-way valve and the chamber). Additionally, two-way (on-off) valves (not shown) may be placed between an MFC and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A is a silane source that supplies source gas nozzles 39 and top nozzle 45. Source nozzle mass flow controller (MFC) 35A' controls the amount of silane delivered to source gas nozzles 39 and top nozzle MFC 35A controls the amount of silane delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E, such as fluorine, silicon tetrafluoride, or equivalents, in reactor cavity 53. The reactive species resulting from this plasma are conveyed to chamber 13 through cleaning gas feed port 54 via applicator tube 55. The materials used to contain the cleaning plasma (e.g. cavity 53 and applicator tube 55) must be resistant to attack by the plasma. The distance between reactor cavity 53 and feed port 54 should be kept as short as practical, as the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in an in situ plasma. Consequently, relatively sensitive components, such as electrostatic chuck 20, do not need to be covered, with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure having a 16-bit data bus and 24-bit address bus. System controller 31 operates under the control of a computer program stored on the hard disk drive or other computer programs, such as programs stored on a floppy disk. The computer program dictates, for example, the timing, mixture of gases, RF power levels and other parameters of a particular process. The interface between a user and the system controller is via a monitor, such as a cathode ray tube (CRT), 65, and a light pen 66, as depicted in FIG. 1C.

Figure 1C:
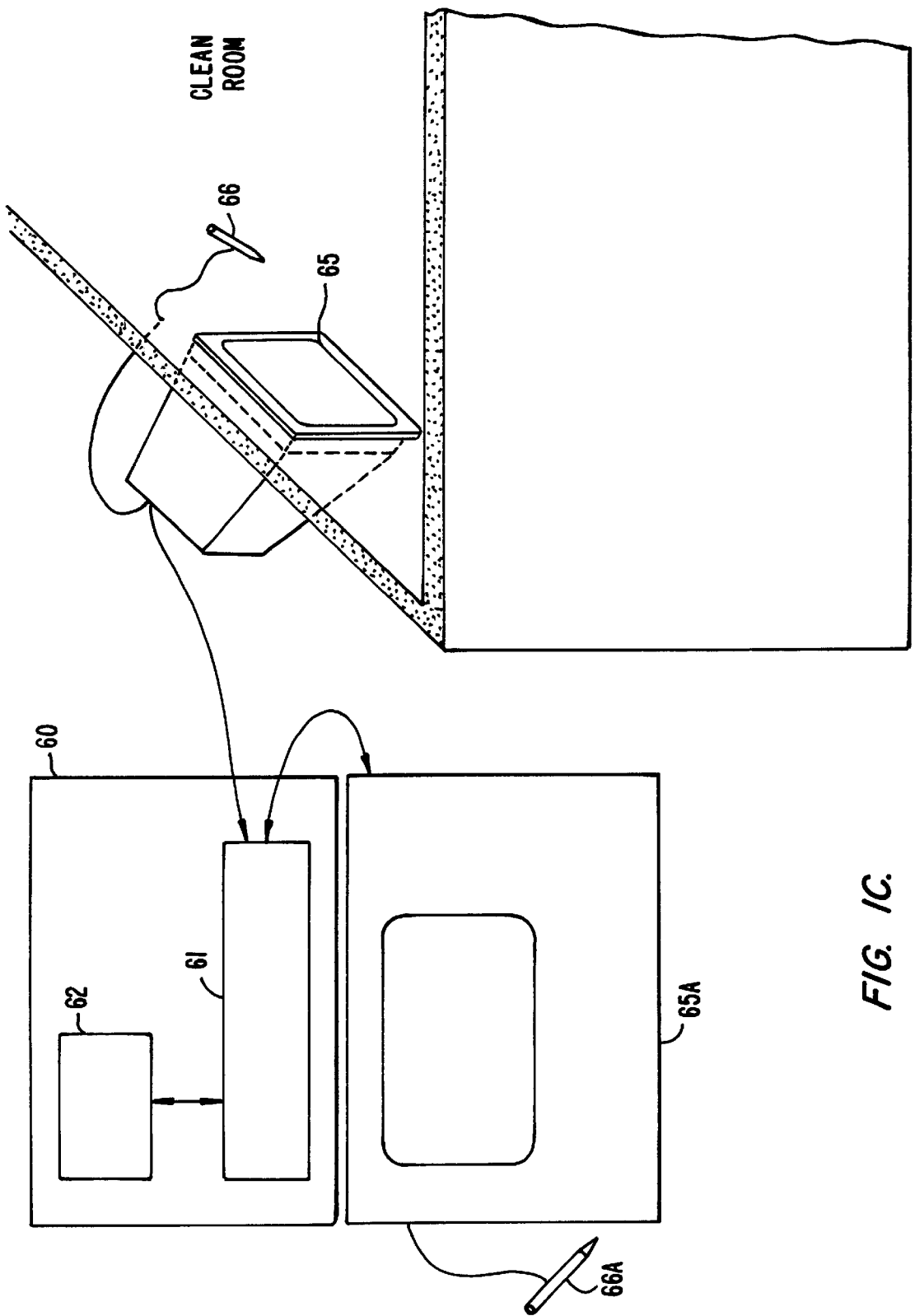
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a memory 62. Preferably, memory 62 may be a hard disk drive, but of course memory 62 may be other kinds of memory, such as ROM, PROM, and others.

System controller 60 operates under the control of a computer program. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer readable programming language such as 68000 assembly language, C, C++, or Pascal. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 1D:
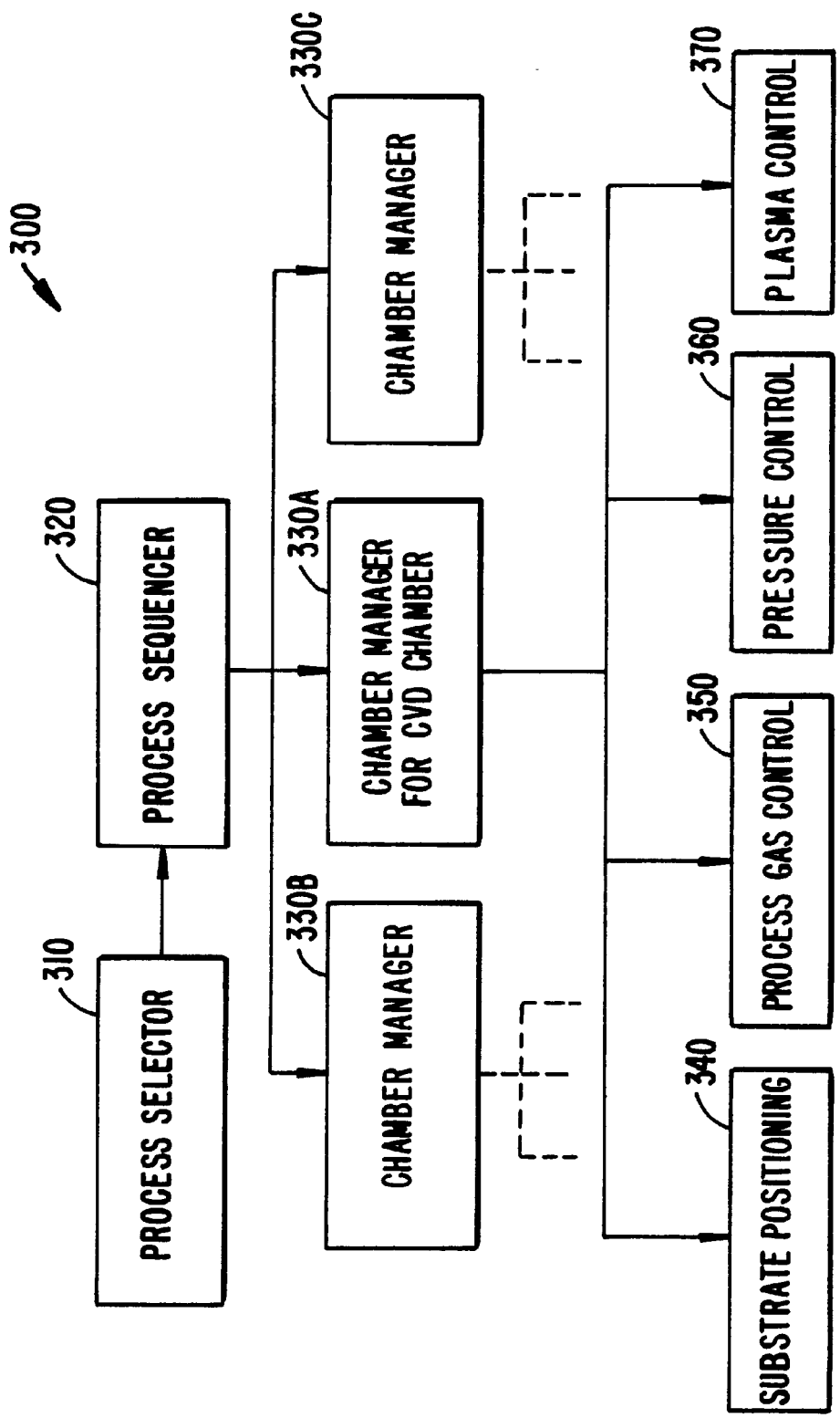
FIG. 1D is a flow chart of an exemplary process control computer program product used to control the exemplary CVD processing chamber of FIG. 1A.
Figure 2:
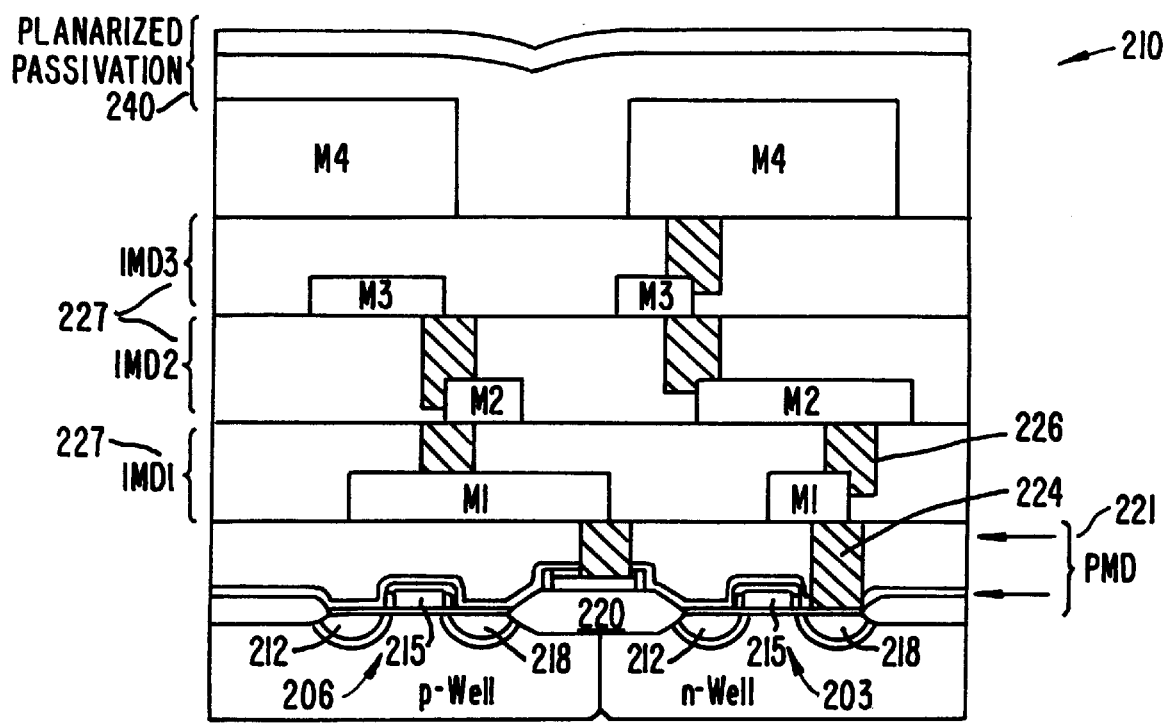
FIG. 2 is a simplified cross-sectional view of an integrated circuit 100 according to the present invention.

FIG. 1D shows an illustrative block diagram of the hierarchical control structure of computer program 300. A user enters a process set number and process chamber number into a process selector subroutine 310 in response to menus or screens displayed on the CRT monitor by using the light pen interface. The process sets are predetermined sets of process parameters necessary to carry out specified processes, and are identified by predefined set numbers. Process selector subroutine 310 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of system controller 60.

A process sequencer subroutine 320 comprises program code for accepting the identified process chamber and set of process parameters from the process selector subroutine 310, and for controlling operation of the various process chambers. Multiple users can enter process set numbers and process chamber numbers, or a user can enter multiple process set numbers and process chamber numbers, so sequencer subroutine 320 operates to schedule the selected processes in the desired sequence. Preferably, sequencer subroutine 320 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is going to be executed next, sequencer subroutine 320 causes execution of the process set by passing the particular process set parameters to a chamber manager subroutine 330A–C, which controls multiple processing tasks in chamber 13 and possibly other chambers (not shown) according to the process set determined by sequencer subroutine 320.

Examples of chamber component subroutines are substrate positioning subroutine 340, process gas control subroutine 350, pressure control subroutine 360, and plasma control subroutine 370. Those having ordinary skill in the art will recognize that other chamber control subroutines can be included depending on what processes are desired to be performed in chamber 13. In operation, chamber manager subroutine 330A selectively schedules or calls the process component subroutines in accordance with the particular process set being executed. Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. Substrate positioning subroutine 340 comprises program code for controlling chamber components that are used to load a substrate onto substrate support number 18. Substrate positioning subroutine 340 may also control transfer of a substrate into chamber 13 from, e.g., a PECVD reactor or other reactor in the multichamber system, after other processing has been completed.

Process gas control subroutine 350 has program code for controlling process gas composition and flow rates. Subroutine 350 controls the open/close position of the safety shut-off valves, and also ramps up/down the mass flow controllers to obtain the desired gas flow rates. All chamber component subroutines, including process gas control subroutine 350, are invoked by chamber manager subroutine 330A. Subroutine 350 receives process parameters from chamber manager subroutine 330A related to the desired gas flow rates.

Typically, process gas control subroutine 350 operates by opening the gas supply lines, and repeatedly (i) reading the necessary mass flow controllers, (ii) comparing the readings to the desired flow rates received from chamber manager subroutine 330A, and (iii) adjusting the flow rates of the gas supply lines as necessary. Furthermore, process gas control subroutine 350 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 350 is programmed to include steps for flowing the inert gas into chamber 13 for an amount of time necessary to stabilize the pressure in the chamber. The above-described steps may then be carried out.

Additionally, when a process gas is to be vaporized from a liquid precursor, for example, tetraethylorthosilane (TEOS), the process gas control subroutine 350 may include steps for bubbling a delivery gas such as helium through the liquid precursor in a bubbler assembly or for introducing the helium to a liquid injection valve. For this type of process, the process gas control subroutine 350 regulates the flow of the delivery gas, the pressure in the bubbler, and the bubbler temperature to obtain the desired process gas flow rates. As discussed above, the desired process gas flow rates are transferred to process gas control subroutine 350 as process parameters.

Furthermore, the process gas control subroutine 350 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 350 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 360 includes program code for controlling the pressure in chamber 13 by regulating the size of the opening of throttle valve in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure.

Alternatively, the chamber pressure may be measured, with a manometer for example, and throttle valve 26 position may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 360 is invoked, the desired, or target, pressure level is received as a parameter from chamber manager subroutine 330A. Pressure control subroutine 360 operates to measure the pressure in chamber 13 by reading one or more conventional pressure manometers connected to the chamber, compare the measure value (s) to the target pressure, obtain proportional, integral, and differential (PID) values from a stored pressure table corresponding to the target pressure, and adjust throttle valve 26 according to the PID values obtained from the pressure table. Alternatively, pressure control subroutine 360 may open or close throttle valve 26 to a particular opening size to regulate the pressure in chamber 13 to a desired pressure or pressure range.

Plasma control subroutine 370 comprises program code for controlling the frequency and power output setting of RF generators 31A and 31B, and for tuning matching networks 32A and 32B. Plasma control subroutine 370, like the previously described chamber component subroutines, is invoked by chamber manager subroutine 330A.

An example of a system which may incorporate some or all of the subsystems and routines described above would be an Ultima System, manufactured by Applied Materials, configured to practice the present invention. The details of such a system are disclosed in U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxim Wang, Manus Wong and Ashok Sinha listed as co-inventors, the disclosure of which is incorporated herein by reference.

III. Deposition of Low Dielectric Constant FSG Films

Figure 3:
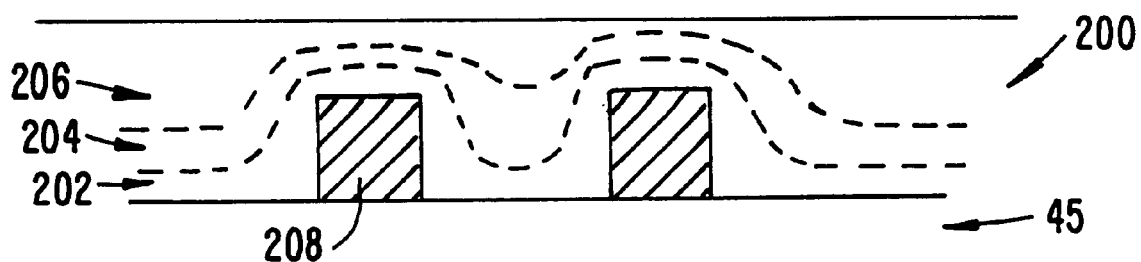
FIG. 3 is a simplified cross-sectional view of an insulating film deposited according to the present invention.

Referring now to FIG. 3, an insulating film 200 formed according to an embodiment of the present invention is shown deposited over metal lines 208. Insulating film 200, which may be used in any of the dielectric layers of circuit 210, is a fluorine-doped silicon oxide film providing a conformal layer with a low dielectric constant, good gap-fill properties and high stability. The low dielectric constant is obtained without reducing film stability or gap-fill properties by allowing the use of a greater concentration of fluorine in the film. Free fluorine is reduced or minimized by employing one or more sequential deposition and heating steps in the deposition of film 200. It is believed that the sequential in situ heating reduces the free fluorine, thereby reducing the presence of HF and $SiF_2$ in the film, improving stability and gap-fill of film 200. It is believed that the sequential heating steps encourage free fluorine to bind with silicon oxide in the film.

Figure 4:
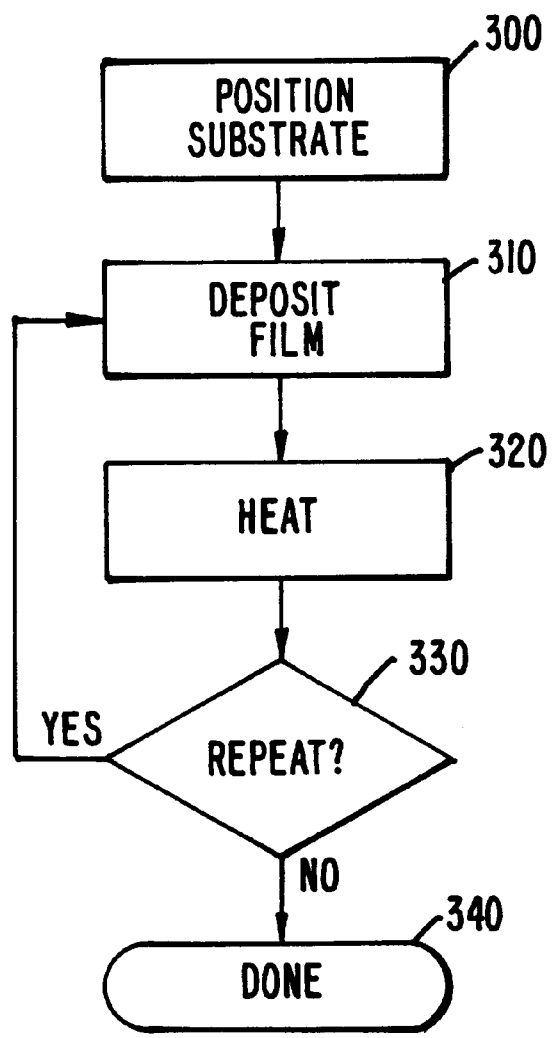
FIG. 4 is a flow chart illustrating the steps performed in applying an insulating film using a process according to the process of the present invention.

FIG. 4 illustrates a preferred embodiment of the present invention. In this preferred embodiment, the multiple film deposition and in situ heating steps are performed in an HDP-CVD chamber such as the exemplary Ultima HDP-CVD chamber described above. Values such as gas flow rates and RF power levels described below are based on such a chamber outfitted for 200-mm wafers. As previously described, however, other chambers and other types of processing equipment, e.g., PECVD equipment, can be used to practice the present invention. The actual gas flow rates, RF power levels and other parameters will vary for chambers of other design and/or volume as would be understood by a person of ordinary skill in the art.

As shown in FIG. 4, the first step in forming insulating film 200 according to the invention is to load a substrate 17 into processing chamber 13 through a vacuum-lock door and placed onto substrate support member 18 (step 300). Once the substrate is properly positioned, an inert gas such as argon, helium or a similar gas is introduced into the chamber and a selected pressure is set and maintained. Preferably, the chamber pressure is set and maintained at about 5–25 mTorr, or more preferably at about 15 mTorr. This pressure is maintained throughout deposition of film 200 by manipulating vacuum system 70 in conjunction with the introduction of gases into the chamber.

Insulating film 200 is then formed in a sequence of depositions. A first portion 202 of film 200 is deposited by forming a plasma from a process gas introduced into process chamber 13 from gas injection nozzles 14 (step 310). The process gas is a mixture comprising silicon, fluorine, oxygen and argon. In a preferred embodiment, the process gas includes a silicon source gas such as silane ($SiH_4$), a fluorine-containing gas such as $SiF_4$, oxygen, and argon or a similar inert gas as an additional constituent to enhance sputtering generated by the HDP process. Other sources of silicon (e.g., TEOS, etc.) and fluorine (e.g., $CF_4$, $C_2F_6$, etc.) may also be used to form films according to the present invention. In one specific embodiment, $SiH_4$ and $SiF_4$ are introduced into process chamber 13 in a ratio of approximately one (1) part $SiF_4$ to four (4) parts $SiH_4$. The process gas may be formed from 5–25 sccm $SiF_4$, 15–100 sccm $SiH_4$, and 25–100 sccm $O_2$. Argon is introduced at a rate of between about 10 to 50 sccm, and most preferably at a rate of about 45–50 sccm.

The relative quantities of the silicon source and the fluorine source may be varied to attain different film characteristics. For example, a lower dielectric constant film is produced by increasing the percentage of fluorine used in the process gas, while film stability is increased by decreasing the amount of fluorine used. Embodiments of the present invention permit the use of greater quantities of fluorine than previously possible while still producing a film with good gap-fill and stability.

The plasma is formed by the application of RF energy to coiled antennas 29 and 30 from SRF generators 31A and 31B while RF energy applied from BRF generator 31C enhances sputtering of the film. In this preferred embodiment, top SRF generator 31A is driven at a frequency of 1.7–1.9 MHz at about 100–5000 W, but preferably at about 1000–2000 W and side SRF generator 31B is driven at a frequency of 1.9–2.1 MHz at about 100–5000 W, but preferably at about 2000–3500 W. Also, BRF generator 31C is driven at a frequency of 13.56 MHz at about 1500–4000 W. Preferably, BRF generator 31C is driven at about 2000–3500 W. The plasma is maintained for a selected period under these conditions to complete deposition of the first portion 202 of insulating film 200.

During deposition of the film, the power supplied to SRF generators 31A and 31B provides indirect heating to the substrate while the sputtering generated by power supplied to BRF generator 31C heats the substrate directly. Preferably the temperature within chamber 10 at the surface of the substrate is kept at between about 300–400° C., and more preferably the temperature at the surface of the substrate is kept at about 350° C.

Deposition of film portion 202 is completed by ceasing the flow of the silicon and fluorine sources in the process gas (step 320) and maintaining the flow of argon and oxygen. Additionally, the bias RF power is switched OFF while the SRF power is maintained. The temperature at the surface of the wafer is maintained between 100–300° C. (preferably between about 100–250° C.). Maintaining the temperature at the substrate surface above 100° C. ensures water desorbtion and provides better fluorine bonding.

In other embodiments, the flow of oxygen rather than silicon is stopped in step 320. It is important to maintain the flow of at least one of the gases in the process gas during step 320 so that enough pressure is maintained in the chamber to allow the transfer of heat to the substrate. Also, maintaining the flow of at least one gas prevents the plasma from being extinguished during step 320, which is desirable so that the plasma does not have to be restarted during the next deposition step. Restarting the plasma in such a manner could lead to poor film quality at the interface of each successively deposited film portion 202, 204, etc. For similar reasons, the plasma of step 310 is preferably initiated with non-deposition gas (e.g., argon or argon and oxygen) before the fluorine and silicon sources are added to the process gas.

In this preferred embodiment, the above conditions of heating step 320 are maintained for a period of between 10–60 seconds, and preferably between 20–45 seconds. It is believed that this heating step serves to reduce the amount of free fluorine in film portion 202 by encouraging free fluorine to bond to silicon oxide.

A second portion 204 of film 200 is then deposited by reintroducing the silicon and fluorine sources into the process gas. Again, process conditions are held for a period to deposit a thin FSG film (step 310). Flow of process gas is then halted and substrate 45 is again heated as described in step 320 for a period of between 10–60 seconds, and preferably between 20–45 seconds. This cycle of deposition and heating continues (step 330) until a film having a desired thickness is deposited on substrate 45. The result is a film having a low dielectric constant (less than 3.5) which has good gap-fill characteristics and stability. Embodiments of the present invention may be used in sub-0.25 μm design rule devices having aspect ratios of up to 3.5:1 or more.

The number of deposition and heating step cycles (combination of steps 310 and 320) may vary depending on the application. In most embodiments, two or three two-step cycles are sufficient to form a highly stable FSG layer having a high fluorine concentration. In other embodiments, four, five or even more cycles may be performed. Generally, employing more two-step cycles increases film stability up to a point. There is a trade off, however, between increased stability and decreased throughput. Accordingly, the number of two-step cycles selected should balance these factors.

The length of time for each heating cycle varies in part with the thickness of the portion of film deposited immediately before the heating cycle. Generally, thicker film portions require longer heating cycles. In most embodiments, the thickness of each successively deposited film portion is approximately equal. This is not a necessary requirement, however. For example, in one embodiment in which three deposition layers are deposited as film 200, each individual portion is approximately 33% of the overall thickness of the film. In another embodiment, each of the first two portions may account for 20–30% of the overall film thickness while the final layer accounts for between 40–60% of overall thickness.

In an alternative embodiment of the present invention, approximately one half of insulating film 200 is deposited in a first step (step 310) followed by a heating cycle (step 320) and than a second deposition step 310 in which the second half of film 200 is deposited. No second heating step is employed in this embodiment so that throughput can be maximized. The second heating step is less critical in this embodiment because the first portion of film 200 is the portion deposited over metal (e.g., aluminum) lines. It is desirable that this portion be particularly stable so that extra loose fluorine that would otherwise be in the film does not attack the metal lines. Additionally, some or all of the second portion of film 200 is etched away during chemical mechanical polishing or similar planarization steps. The concept employed in this embodiment can be applied to other embodiments, i.e., no heating step is used to further stabilize the final portion of film 200 is optional in these embodiments.

In still another embodiment, film 200 is deposited in a single step and then subject to the in situ heating step of the present invention. Preferably, film 200 is deposited by maintaining the above deposition conditions for 300–500 seconds followed by a longer heating cycle of approximately 45–180 seconds. This extended heating period serves to encourage the formation of bonds between free fluorine and silicon oxide, reducing the presence of free fluorine in film 200. Because of its increased throughput, this embodiment is currently the most preferred embodiment.

The method of the present invention is not intended to be limited by the specific parameters set forth above. Those of ordinary skill in the art will realize that different processing conditions and different reactant sources can be used without departing from the spirit of the invention. Other equivalent or alternative methods of depositing an insulating layer according to the present invention will be apparent to those skilled in the art. For example, films produced according to embodiments of the present invention may include additional heating cycles to further stabilize the film. These equivalents and alternatives are intended to be included within the scope of the present invention. Other variations will be apparent to persons of skill in the art. Accordingly, it is not intended to limit the invention except as provided in the appended claims.

What is claimed is:

1. A method for forming an insulating film on a substrate, said method comprising:
    (a) flowing a process gas comprising silicon, fluorine and oxygen sources into a chamber;
    (b) forming a plasma from said process gas to deposit at least a portion of said insulating film over said substrate;
    (c) stopping the flow of said fluorine source and at least one of said silicon or oxygen sources while maintaining said plasma and maintaining a surface of said substrate at a temperature above about 100° C. for a first time period; and
    (d) thereafter, restarting the flow of said fluorine source and said at least one of said silicon or oxygen sources to deposit a second portion of said insulating film over said substrate.

2. The method of claim 1 wherein (c) includes maintaining a surface of said substrate at a temperature between 100–300° C. for between 10–60 seconds.

3. The method of claim 1 wherein (b) includes the step of biasing the plasma toward the substrate and (c) includes the step of stopping said biasing.

4. The method of claim 1 wherein said silicon source is silane ($SiH_4$) and wherein said fluorine source is $SiF_4$.

5. The method of claim 1 wherein said process gas further includes an inert gas and wherein the flow of at least one of said oxygen source or inert gas is maintained between (b) and (c).

6. The method of claim 1 further comprising:

(e) after (c), again stopping the flow of at least one of said fluorine source and at least one of said silicon or oxygen sources while maintaining a surface of said substrate at a temperature above about 100° C. for a second time period.

7. The method of claim 6 wherein (e) includes maintaining a surface of said substrate at a temperature between about 100–300° C. for between 10–60 seconds.

8. The method of claim 7 wherein (b) includes biasing the plasma toward the substrate and (c) includes stopping said biasing, and wherein (e) further includes the step of again biasing the plasma toward the substrate.

9. The method of claim 1 wherein said insulating film has a dielectric constant of less than about 3.5.

10. The method of claim 9 wherein a portion of said insulating film is deposited between closely-spaced conductive lines deposited on said substrate, said conductive lines having an aspect ratio of at least 1.8 and deposited under 0.35 mm or less design rules.

11. The method of claim 10 further comprising:

(e) stopping the deposition of said second portion of said insulating film by removing said fluorine and silicon sources from said process gas; and (f) maintaining a surface of said substrate at a temperature between 100–300° C. for between 10–60 seconds.

12. The method of claim 11 further comprising:

(f) depositing at least a third portion of said insulating film over said second portion by reintroducing said silicon and fluorine sources into said plasma.

13. The method of claim 10 wherein said insulating film has a dielectric constant of less than about 3.5.

14. A method for forming an insulating film over a substrate disposed in a chemical vapor deposition system that includes a deposition chamber, a coil surrounding at least a portion of the deposition chamber said coil coupled to a first RF power supply, first and second electrodes and a second RF power supply coupled to one of said electrodes to bias a plasma formed in said chamber, said method comprising the steps of:

(a) flowing a process gas comprising silicon, fluorine and oxygen sources into the chamber (b) forming a plasma from said process gas to deposit at least a portion of said insulating film over said substrate, said plasma being formed by application of RF energy from said first RF power supply to said coil, whereby application of RF energy from said first RF power supply also heats an upper surface of said substrate to a temperature above 100° C.;

(c) biasing said plasma toward said substrate by application of RF energy from said second RF power supply to one of said electrodes;

(d) stopping the flow of said fluorine source and at least one of said silicon or oxygen sources to stop deposition of said portion of said insulating film; and (e) switching off said second RF power supply while maintaining said plasma by application of energy from said first RF power supply to continue to heat the substrate for at least 45 seconds.

15. The method of claim 14 wherein, after (e), said plasma is stopped and said substrate is removed from said chamber.

16. A method for forming an insulating film, the method comprising the steps of:

(a) depositing a first portion of said insulating film on a substrate, said first portion formed from a plasma created by exciting a process gas with energy, said first process gas comprising silicon, fluorine and oxygen sources;

(b) stopping the deposition of said first portion of said insulating film by removing said fluorine and silicon sources from said process gas;

(c) maintaining said plasma and maintaining a surface of said substrate at a temperature above 100° C. for between 10–60 seconds; and (d) thereafter, depositing at least a second portion of said insulating film over said first portion by reintroducing said silicon and fluorine sources into said plasma.

* * * * *